(12) United States Patent
Morris et al.

(10) Patent No.: US 9,137,934 B2
(45) Date of Patent: *Sep. 15, 2015

(54) COMPARTMENTALIZED SHIELDING OF SELECTED COMPONENTS

(75) Inventors: Thomas Scott Morris, Lewisville, NC (US); Ulrik Riis Madsen, Norresundby (DK); Brian D. Sawyer, Menlo Park, CA (US); Milind Shah, San Diego, CA (US); John Robert Siomkos, Greensboro, NC (US); Mark Alan Crandall, Oak Ridge, NC (US); Dan Carey, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 674 days.

This patent is subject to a terminal disclaimer.

(21) Appl. No.: 13/189,838

(22) Filed: Jul. 25, 2011

(65) Prior Publication Data
US 2012/0044653 A1 Feb. 23, 2012

Related U.S. Application Data

(60) Provisional application No. 61/374,705, filed on Aug. 18, 2010.

(51) Int. Cl.
*H05K 3/30* (2006.01)
*H05K 9/00* (2006.01)
(Continued)

(52) U.S. Cl.
CPC ............ *H05K 9/0024* (2013.01); *H05K 1/0218* (2013.01); *H05K 3/284* (2013.01); *H05K 2201/0715* (2013.01); *H05K 2201/09972* (2013.01); *Y10T 29/49155* (2015.01)

(58) Field of Classification Search
CPC ... H05K 3/284; H05K 9/0024; H05K 1/0218; H05K 2201/0715; H05K 2201/09972; Y10T 29/49155
USPC ................ 29/841, 832, 829, 825, 592.1, 846, 29/412–416; 438/953, 121, 127, 123, 107, 438/111; 361/728
See application file for complete search history.

(56) References Cited

U.S. PATENT DOCUMENTS

| 3,566,190 A | 2/1971 | Huebner |
| 3,907,616 A | 9/1975 | Wiemer |

(Continued)

FOREIGN PATENT DOCUMENTS

| CN | 1855451 A | 11/2006 |
| EP | 1715520 A1 | 10/2006 |

(Continued)

OTHER PUBLICATIONS

Notice of Allowance for U.S. Appl. No. 11/952,617 mailed Jan. 8, 2013, 8 pages.

(Continued)

*Primary Examiner* — Peter DungBa Vo
*Assistant Examiner* — Azm Parvez
(74) *Attorney, Agent, or Firm* — Withrow & Terranova, P.L.L.C.

(57) ABSTRACT

Embodiments include devices and methods for manufacturing a module having a first shielded compartment and a second shielded compartment, wherein the first shielded compartment is electrically isolated from the second shielded compartment. Electrical conductivity is controlled in a manner in which current flow between shielded circuits is directed to reduce or eliminate energy from being coupled between one or more shielded compartments on the same module. Each module may have a plurality of individual shielded compartments, where each compartment has a dedicated ground plane. The shields for each compartment may be tied to the dedicated ground plane of the compartment. Because the dedicated ground planes are not tied together, each of the shielded compartments on the modules remains isolated from all the other shielded compartments on the modules. In some embodiments having a plurality of shielded compartments, there is at least one isolated shielded compartment depending upon the design needs of the module.

17 Claims, 13 Drawing Sheets

(51) Int. Cl.
H05K 1/02 (2006.01)
H05K 3/28 (2006.01)

(56) References Cited

U.S. PATENT DOCUMENTS

| | | | |
|---|---|---|---|
| 3,907,617 A | 9/1975 | Zwernemann | |
| 4,680,676 A | 7/1987 | Petratos et al. | |
| 5,389,738 A | 2/1995 | Piosenka et al. | |
| 5,406,630 A | 4/1995 | Piosenka et al. | |
| 5,436,203 A | 7/1995 | Lin | |
| 5,459,368 A | 10/1995 | Onishi et al. | |
| 5,473,512 A | 12/1995 | Degani et al. | |
| 5,639,989 A | 6/1997 | Higgins, III | |
| 5,646,828 A | 7/1997 | Degani et al. | |
| 5,650,659 A | 7/1997 | Mostafazadeh et al. | |
| 5,977,626 A | 11/1999 | Wang et al. | |
| 6,004,180 A | 12/1999 | Knall et al. | |
| 6,011,698 A | 1/2000 | Buehler | |
| 6,137,693 A | 10/2000 | Schwiebert et al. | |
| 6,150,193 A | 11/2000 | Glenn | |
| 6,163,454 A | 12/2000 | Strickler | |
| 6,297,957 B1 | 10/2001 | Johnson et al. | |
| 6,448,583 B1 | 9/2002 | Yoneda et al. | |
| 6,448,793 B1 | 9/2002 | Barratt et al. | |
| 6,466,416 B1 | 10/2002 | Honjo et al. | |
| 6,538,196 B1 | 3/2003 | MacDonald et al. | |
| 6,590,152 B1 | 7/2003 | Horio et al. | |
| 6,599,779 B2 | 7/2003 | Shim et al. | |
| 6,613,660 B2 | 9/2003 | Kahlert et al. | |
| 6,633,073 B2 | 10/2003 | Rezvani et al. | |
| 6,657,592 B2 | 12/2003 | Dening et al. | |
| 6,707,168 B1 | 3/2004 | Hoffman et al. | |
| 6,717,485 B2 | 4/2004 | Kolb et al. | |
| 6,791,795 B2 | 9/2004 | Ohtomo et al. | |
| 6,807,731 B2 | 10/2004 | Brandenburg et al. | |
| 6,825,560 B1 | 11/2004 | Walker et al. | |
| 6,838,750 B2 | 1/2005 | Nuytkens et al. | |
| 6,887,787 B2 | 5/2005 | Farnworth | |
| 6,900,383 B2 | 5/2005 | Babb et al. | |
| 6,946,324 B1 | 9/2005 | McLellan et al. | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,087,461 B2 | 8/2006 | Park et al. | |
| 7,087,462 B1 | 8/2006 | Park et al. | |
| 7,109,410 B2 | 9/2006 | Arnold et al. | |
| 7,109,817 B2 | 9/2006 | Kolb et al. | |
| 7,125,744 B2 | 10/2006 | Takehara et al. | |
| 7,148,574 B2 | 12/2006 | Lee et al. | |
| 7,187,060 B2 | 3/2007 | Usui | |
| 7,227,719 B2 | 6/2007 | Sasaki et al. | |
| 7,259,041 B2 | 8/2007 | Stelzl et al. | |
| 7,342,303 B1 | 3/2008 | Berry et al. | |
| 7,348,663 B1 | 3/2008 | Kirloskar et al. | |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,548,430 B1 | 6/2009 | Huemoeller et al. | |
| 7,598,606 B2 | 10/2009 | Chow et al. | |
| 7,633,170 B2 | 12/2009 | Yang et al. | |
| 7,633,765 B1 | 12/2009 | Scanlan et al. | |
| 7,635,918 B2 | 12/2009 | Yoshida | |
| 7,636,245 B2 | 12/2009 | Clancy et al. | |
| 7,643,311 B2 | 1/2010 | Coffy | |
| 7,651,889 B2 | 1/2010 | Tang et al. | |
| 7,665,201 B2 | 2/2010 | Sjoedin | |
| 7,671,451 B2 | 3/2010 | Lee et al. | |
| 7,700,411 B2 | 4/2010 | Yang et al. | |
| 7,701,728 B2 | 4/2010 | Hatanaka et al. | |
| 7,772,046 B2 | 8/2010 | Pagaila et al. | |
| 7,829,981 B2 | 11/2010 | Hsu | |
| 7,902,643 B2 | 3/2011 | Tuttle | |
| 7,928,538 B2 | 4/2011 | Salzman | |
| 8,013,258 B2 | 9/2011 | Wu | |
| 8,062,930 B1 * | 11/2011 | Shah et al. | 438/110 |
| 8,093,690 B2 | 1/2012 | Ko et al. | |
| 8,110,441 B2 * | 2/2012 | Chandra et al. | 438/113 |
| 8,220,145 B2 | 7/2012 | Hiner et al. | |
| 8,268,677 B1 | 9/2012 | Pagaila | |
| 8,373,264 B2 | 2/2013 | Welch et al. | |
| 8,434,220 B2 | 5/2013 | Rao et al. | |
| 8,507,319 B2 | 8/2013 | Chow et al. | |
| 8,614,899 B2 | 12/2013 | Madsen et al. | |
| 8,748,230 B2 | 6/2014 | Welch et al. | |
| 2002/0036345 A1 | 3/2002 | Iseki et al. | |
| 2002/0118529 A1 | 8/2002 | Babin et al. | |
| 2003/0011049 A1 | 1/2003 | Nuytkens et al. | |
| 2003/0048581 A1 | 3/2003 | Ohtomo et al. | |
| 2003/0062541 A1 | 4/2003 | Warner | |
| 2003/0151122 A1 | 8/2003 | Davies | |
| 2004/0063246 A1 | 4/2004 | Karnezos | |
| 2004/0103509 A1 | 6/2004 | Bidard et al. | |
| 2004/0104473 A1 | 6/2004 | Farnworth | |
| 2004/0178500 A1 | 9/2004 | Usui | |
| 2004/0209434 A1 | 10/2004 | Seaford et al. | |
| 2004/0214023 A1 | 10/2004 | Park et al. | |
| 2004/0222511 A1 | 11/2004 | Zhang | |
| 2004/0232536 A1 | 11/2004 | Fukuzumi | |
| 2004/0238934 A1 | 12/2004 | Warner et al. | |
| 2005/0046001 A1 | 3/2005 | Warner | |
| 2005/0153061 A1 | 7/2005 | Nuytkens et al. | |
| 2006/0033184 A1 | 2/2006 | Park et al. | |
| 2006/0151203 A1 | 7/2006 | Krueger et al. | |
| 2006/0223577 A1 | 10/2006 | Ouzillou | |
| 2006/0244131 A1 | 11/2006 | Kobayashi et al. | |
| 2006/0273813 A1 | 12/2006 | Coffy | |
| 2006/0274517 A1 | 12/2006 | Coffy | |
| 2007/0030661 A1 | 2/2007 | Morris et al. | |
| 2007/0042593 A1 | 2/2007 | Lee et al. | |
| 2007/0045248 A1 | 3/2007 | Schein et al. | |
| 2007/0058748 A1 | 3/2007 | Kim et al. | |
| 2007/0062637 A1 | 3/2007 | Sjoedin | |
| 2007/0155053 A1 | 7/2007 | Karnezos | |
| 2007/0163802 A1 | 7/2007 | Monthei | |
| 2007/0200210 A1 | 8/2007 | Zhao et al. | |
| 2007/0222697 A1 | 9/2007 | Caimi et al. | |
| 2007/0290322 A1 | 12/2007 | Zhao et al. | |
| 2008/0019112 A1 | 1/2008 | Hatanaka et al. | |
| 2008/0054421 A1 | 3/2008 | Dimaano et al. | |
| 2008/0108179 A1 | 5/2008 | Mistry et al. | |
| 2008/0112151 A1 | 5/2008 | Thompson et al. | |
| 2008/0142938 A1 | 6/2008 | Chow et al. | |
| 2008/0157316 A1 | 7/2008 | Yang et al. | |
| 2008/0210462 A1 | 9/2008 | Kawagishi et al. | |
| 2008/0224306 A1 | 9/2008 | Yang | |
| 2008/0308912 A1 | 12/2008 | Cha et al. | |
| 2008/0317188 A1 | 12/2008 | Staszewski et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 * | 1/2009 | Madsen et al. | 361/818 |
| 2009/0002970 A1 | 1/2009 | Leahy et al. | |
| 2009/0002971 A1 | 1/2009 | Carey et al. | |
| 2009/0002972 A1 | 1/2009 | Carey et al. | |
| 2009/0016039 A1 | 1/2009 | Imamura | |
| 2009/0025211 A1 | 1/2009 | Hiner et al. | |
| 2009/0051011 A1 | 2/2009 | Usami | |
| 2009/0066588 A1 | 3/2009 | Cheng et al. | |
| 2009/0072357 A1 | 3/2009 | Tang et al. | |
| 2009/0072364 A1 | 3/2009 | Punzalan et al. | |
| 2009/0079041 A1 | 3/2009 | Huang et al. | |
| 2009/0140402 A1 | 6/2009 | Ohtani | |
| 2009/0227273 A1 | 9/2009 | McCune, Jr. | |
| 2009/0233562 A1 | 9/2009 | Kim et al. | |
| 2009/0270054 A1 | 10/2009 | Ridgers et al. | |
| 2009/0302438 A1 | 12/2009 | Chauhan et al. | |
| 2009/0315156 A1 | 12/2009 | Harper | |
| 2010/0199492 A1 | 8/2010 | Hiner et al. | |
| 2010/0279730 A1 | 11/2010 | Ortiz | |
| 2011/0014880 A1 | 1/2011 | Nicolson et al. | |

(56) References Cited

U.S. PATENT DOCUMENTS

| | | | |
|---|---|---|---|
| 2011/0017263 | A1 | 1/2011 | Gibson et al. |
| 2011/0038136 | A1 | 2/2011 | Carey et al. |
| 2011/0084378 | A1 | 4/2011 | Welch et al. |
| 2011/0225803 | A1 | 9/2011 | Hiner et al. |
| 2011/0235282 | A1 | 9/2011 | Leahy et al. |
| 2011/0298109 | A1 | 12/2011 | Pagaila et al. |
| 2011/0298670 | A1 | 12/2011 | Jung et al. |
| 2012/0074538 | A1 | 3/2012 | Tsai et al. |
| 2012/0126378 | A1 | 5/2012 | San Antonio et al. |
| 2012/0182706 | A1 | 7/2012 | Siomkos et al. |
| 2012/0270371 | A1 | 10/2012 | Debar et al. |

FOREIGN PATENT DOCUMENTS

| | | | | |
|---|---|---|---|---|
| EP | 1717857 | A2 | 11/2006 | |
| EP | 1764834 | B1 | 3/2007 | |
| JP | 11163583 | A | 6/1999 | |
| JP | 2004207352 | A | 7/2004 | |
| JP | 2005039007 | A | 2/2005 | |
| JP | 2005109306 | A * | 4/2005 | ............ H01L 23/00 |
| JP | 2006332255 | A | 12/2006 | |
| JP | 2007311396 | A | 11/2007 | |
| KR | 20060113412 | A | 11/2006 | |
| WO | 0035085 | A1 | 6/2000 | |
| WO | 03058812 | A1 | 7/2003 | |
| WO | 2004019490 | A1 | 3/2004 | |
| WO | 2004060034 | A1 | 7/2004 | |
| WO | 2007060784 | A1 | 5/2007 | |
| WO | 2007132560 | A1 | 11/2007 | |
| WO | 2009144960 | A1 | 12/2009 | |
| WO | 2010014103 | A1 | 2/2010 | |
| WO | 2010021262 | A1 | 2/2010 | |
| WO | WO 2010021262 | A1 * | 2/2010 | ............ H05K 3/28 |

OTHER PUBLICATIONS

Non-final Office Action for U.S. Appl. No. 13/034,787 mailed Jan. 16, 2013, 9 pages.
Non-final Office Action for U.S. Appl. No. 12/797,381 mailed Jan. 8, 2013, 20 pages.
Non-final Office Action for U.S. Appl. No. 13/415,643 mailed Jan. 3, 2013, 17 pages.
Non-Final Office Action for U.S. Appl. No. 13/034,755, mailed Aug. 15, 2013, 6 pages.
Non-Final Office Action for U.S. Appl. No. 13/034,787, mailed Aug. 9, 2013, 9 pages.
Advisory Action for U.S. Appl. No. 12/797,381, mailed Jul. 17, 2013, 3 pages.
Quayle Action for U.S. Appl. No. 13/415,643, mailed Jul. 11, 2013, 6 pages.
Notice of Allowance for U.S. Appl. No. 13/415,643, mailed Aug. 15, 2013, 8 pages.
Non-final Office Action for U.S. Appl. No. 12/766,347 mailed Jun. 29, 2012, 11 pages.
Notice of Allowance for U.S. Appl. No. 11/952,592 mailed Aug. 6, 2012, 7 pages.
Notice of Allowance for U.S. Appl. No. 11/952,670 mailed Aug. 24, 2012, 7 pages.
Notice of Allowance for U.S. Appl. No. 13/187,814 mailed Sep. 10, 2012, 8 pages.
Chomerics, "Cho-Shield Conductive Coatings," Last modified Dec. 8, 2000, Chomerics, A Division of Parker Hannifin Corporation. http://www.chomerics.com/products/choshield_coatings.htm, 3 pages.
Final Office Action for U.S. Appl. No. 11/952,592 mailed Jan. 18, 2012, 10 pages.
Final Office Action for U.S. Appl. No. 13/034,787, mailed Nov. 15, 2013, 12 pages.
Examiner's Answer for U.S. Appl. No. 12/797,381, mailed Dec. 31, 2013, 6 pages.
Notice of Allowance for U.S. Appl. No. 13/151,499, mailed Dec. 19, 2013, 8 pages.
Non-Final Rejection for U.S. Appl. No. 12/913,364 mailed Feb. 13, 2012, 32 pages.
Final rejection for U.S. Appl. No. 11/952,617 mailed Feb. 16, 2012, 15 pages.
Notice of Allowance for U.S. Appl. No. 11/952,513 mailed Mar. 6, 2012, 16 pages.
Second Office Action for Chinese patent application 200880104171.1 mailed Feb. 16, 2012, 14 pages.
Final Office Action for U.S. Appl. No. 13/117,284 mailed Feb. 29, 2012, 8 pages.
Final Office Action for U.S. Appl. No. 13/034,787, mailed Mar. 19, 2013, 9 pages.
Final Office Action for U.S. Appl. No. 12/797,381, mailed May 16, 2013, 19 pages.
Advisory Action for U.S. Appl. No. 13/034,787, mailed May 17, 2013, 3 pages.
Notice of Allowance for U.S. Appl. No. 13/117,284 mailed May 1, 2012, 15 pages.
Non-final Office Action for U.S. Appl. No. 11/952,592 mailed Jun. 12, 2012, 28 pages.
Notice of Allowance for U.S. Appl. No. 11/952,617 mailed Jun. 4, 2012, 24 pages.
Notice of Allowance for U.S. Appl. No. 12/913,364 mailed Jun. 8, 2012, 12 pages.
Notice of Allowance for U.S. Appl. No. 11/199,319 mailed Oct. 2, 2008, 6 pages, now US Patent No. 7,451,539.
Non-final Office Action for U.S. Appl. No. 11/435,913, mailed May 21, 2010, 5 pages, now US Patent No. 8,062,930.
Final Office Action for U.S. Appl. No. 11/435,913 mailed Nov. 17, 2009, 8 pages, now US Patent No. 8,062,930.
Non-final Office Action for U.S. Appl. No. 11/435,913 mailed Mar. 2, 2009, 8 pages, now US Patent No. 8,062,930.
Final Office Action for U.S. Appl. No. 11/435,913 mailed Aug. 15, 2008, 8 pages, now US Patent No. 8,062,930.
Non-final Office Action for U.S. Appl. No. 11/435,913 mailed Jan. 7, 2008, 6 pages, now US Patent No. 8,062,930.
Non-final Office for U.S. Appl. No. 11/768,014 mailed Mar. 25, 2010, 9 pages.
Non-final Office for U.S. Appl. No. 11/768,014 mailed Jul. 10, 2009, 6 pages.
Non-final Office Action for U.S. Appl. No. 11/768,014 mailed Jan. 21, 2009, 9 pages.
Non-final Office Action for U.S. Appl. No. 11/952,484 mailed Oct. 27, 2011, 22 pages.
Final Office Action for U.S. Appl. No. 11/952,484 mailed Oct. 5, 2010, 18 pages.
Non-final Office Action for U.S. Appl. No. 11/952,484 mailed Jan. 8, 2010, 16 pages.
Final Office Action for U.S. Appl. No. 11/952,513 mailed Oct. 26, 2011, 16 pages.
Non-final Office Action for U.S. Appl. No. 11/952,513 mailed May 10, 2011, 19 pages.
Non-final Office Action for U.S. Appl. No. 13/117,284 mailed Nov. 9, 2011, 12 pages.
Non-final Office Action for U.S. Appl. No. 11/952,545 mailed Oct. 23, 2009, 12 pages.
Non-final Office Action for U.S. Appl. No. 11/952,592 mailed Sep. 19, 2011, 9 pages.
Final Office Action for U.S. Appl. No. 11/952,592 mailed Feb. 24, 2011, 10 pages.
Non-final Office Action for U.S. Appl. No. 11/952,592 mailed Dec. 15, 2010, 9 pages.
Final Office Action for U.S. Appl. No. 11/952,592 mailed Apr. 16, 2010, 8 pages.
Non-final Office Action for U.S. Appl. No. 11/952,592 mailed Jul. 28, 2009, 7 pages.
Non-final Office Action for U.S. Appl. No. 11/952,617 mailed Jul. 28, 2011, 9 pages.
Final Office Action for U.S. Appl. No. 11/952,617 mailed Nov. 20, 2009, 16 pages.

(56) References Cited

OTHER PUBLICATIONS

Non-final Office Action for U.S. Appl. No. 11/952,617 mailed Sep. 26, 2008, 10 pages.
Non-final Office Action for U.S. Appl. No. 11/952,634 mailed Jun. 13, 2011, 7 pages.
Notice of Allowance for U.S. Appl. No. 11/952,634 mailed Mar. 3, 2011, 3 pages.
Final Office Action for U.S. Appl. No. 11/952,634 mailed Feb. 1, 2011, 7 pages.
Final Office Action for U.S. Appl. No. 11/952,634 mailed Dec. 23, 2010, 9 pages.
Non-final Office Action for U.S. Appl. No. 11/952,634 mailed Jul. 21, 2010, 6 pages.
Office Action for Chinese patent application 200880104171.1 mailed Jun. 2, 2011, 20 pages.
Non-final Office Action for U.S. Appl. No. 11/952,670 mailed Jun. 22, 2011, 4 pages.
Non-final Office Action for U.S. Appl. No. 11/952,670 mailed May 27, 2010, 6 pages.
Notice of Allowance for U.S. Appl. No. 11/952,670 mailed Oct. 21, 2009, 5 pages.
Notice of Allowance for U.S. Appl. No. 11/952,690 mailed Oct. 12, 2010, 4 pages.
Notice of Allowance for U.S. Appl. No. 11/952,690 mailed Sep. 27, 2010, 4 pages.
Notice of Allowance for U.S. Appl. No. 11/952,690 mailed Aug. 30, 2010, 7 pages.
Non-final Office Action for U.S. Appl. No. 11/952,690 mailed Mar. 25, 2010, 8 pages.
Chomerics, "CHO-Shield Coatings," web page, 2001, 1 page.
International Search Report for PCT/US2008/068153 mailed Dec. 9, 2008, 3 pages.
RF Micro Devices, "Fractional-N RF Synthesizer with Modulator and Digital IF Filter," 2005, 2 pages.
Corrected Notice of Allowability for U.S. Appl. No. 13/034,787, mailed Jul. 29, 2014, 5 pages.
Notice of Allowance for U.S. Appl. No. 13/034,787, mailed May 1, 2014, 9 pages.
Advisory Action for U.S. Appl. No. 13/034,787, mailed Jan. 27, 2014, 4 pages.
Final Office Action for U.S. Appl. No. 13/034,755, mailed Jan. 31, 2014, 10 pages.
Advisory Action for U.S. Appl. No. 13/034,787, mailed Feb. 26, 2014, 4 pages.
Advisory Action for U.S. Appl. No. 13/034,755, mailed Mar. 4, 2014, 3 pages.
Notice of Allowance for U.S. Appl. No. 13/034,755, mailed Oct. 17, 2014, 7 pages.
Final Office Action for U.S. Appl. No. 13/036,272, mailed Oct. 20, 2014, 6 pages.
Advisory Action for U.S. Appl. No. 13/036,272, mailed Jan. 8, 2015, 3 pages.
Non-Final Office Action for U.S. Appl. No. 13/036,272, mailed Apr. 14, 2015, 7 pages.
Non-Final Office Action for U.S. Appl. No. 14/447,847, mailed May 7, 2015, 7 pages.

\* cited by examiner

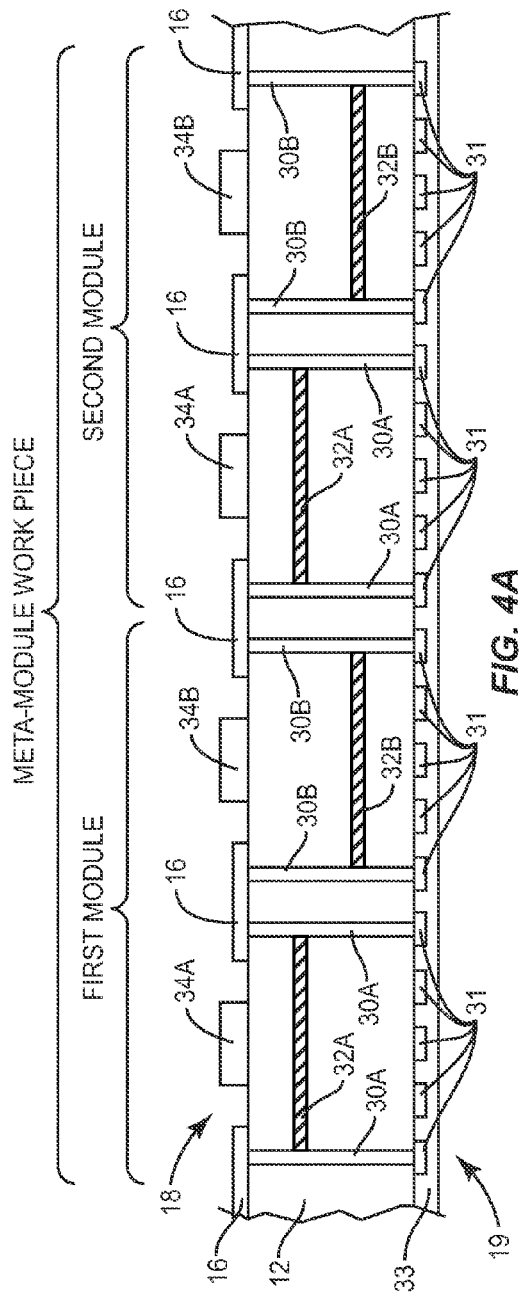
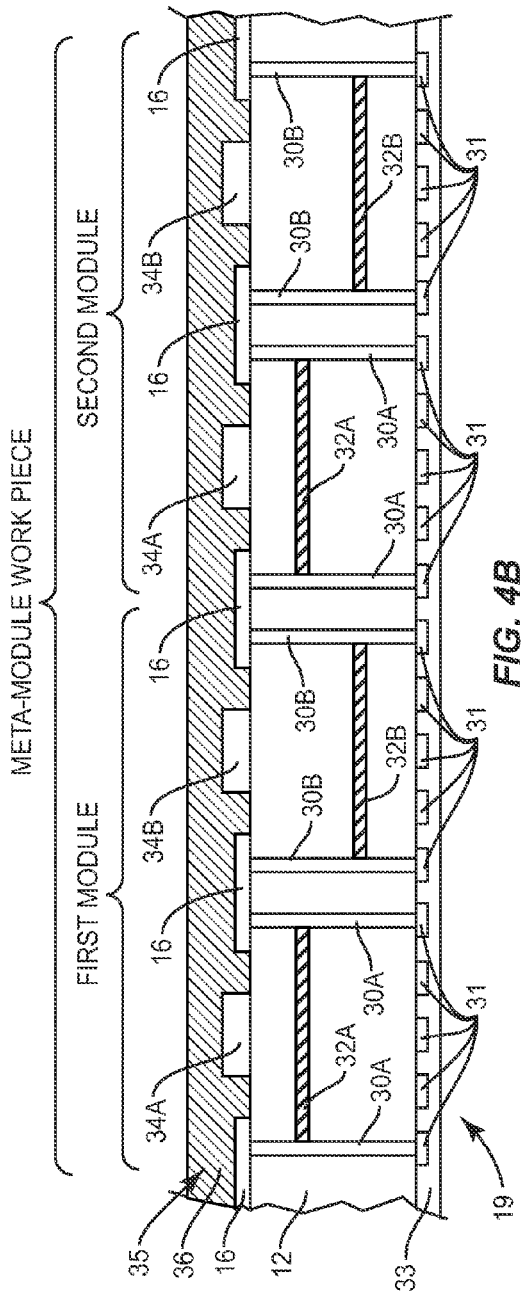
FIG. 4A
FIG. 4B

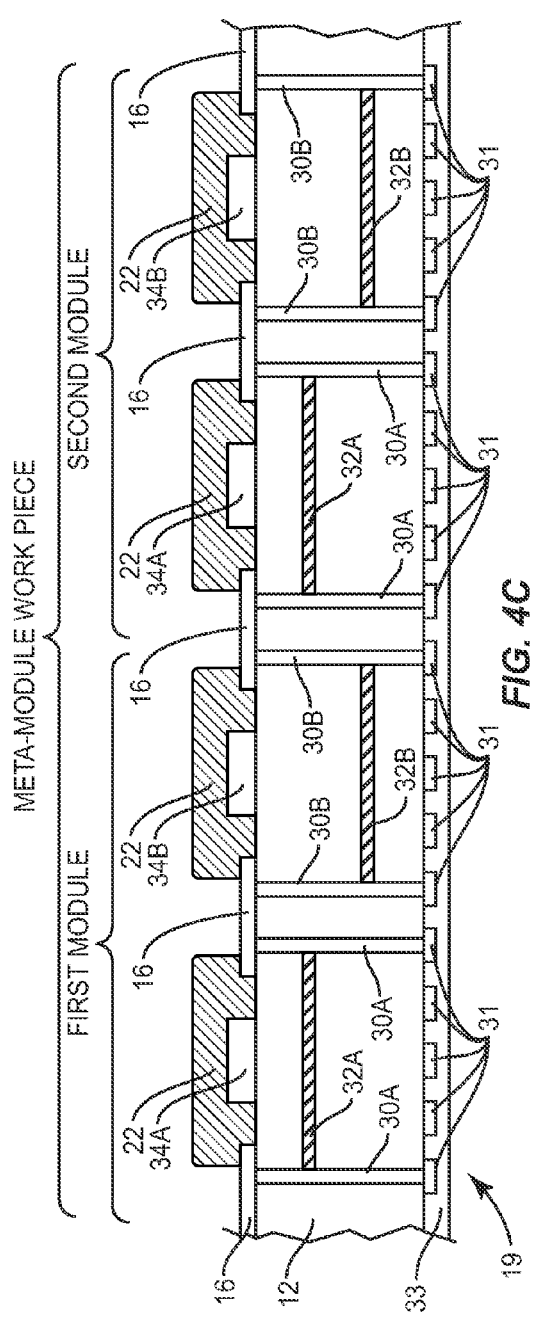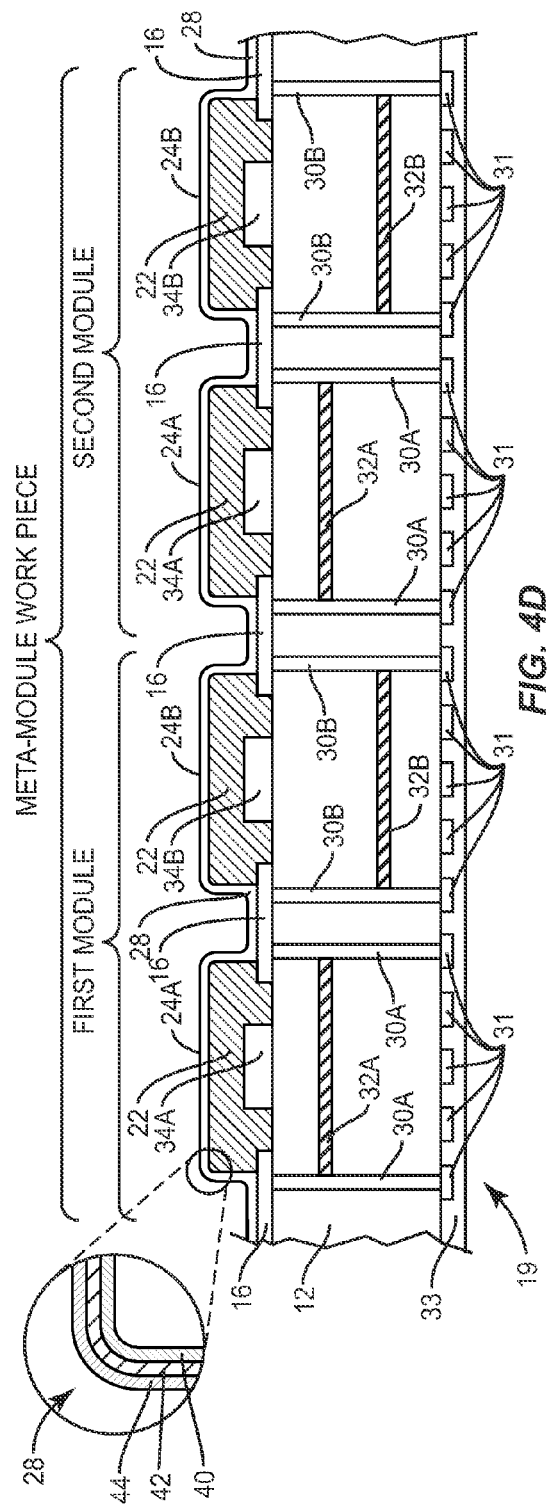

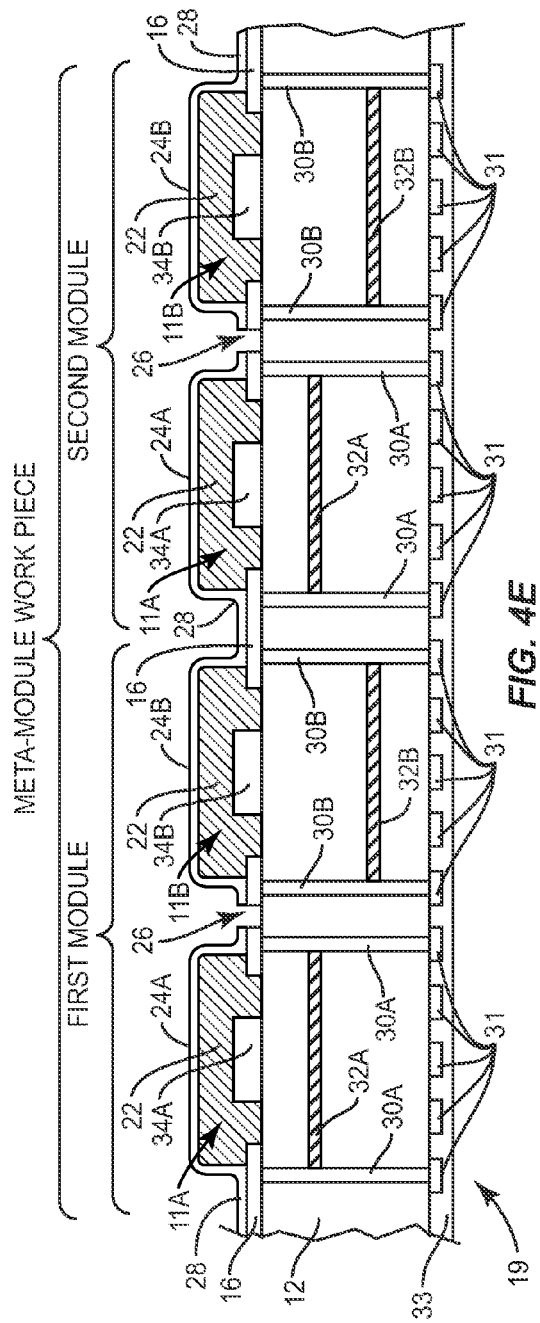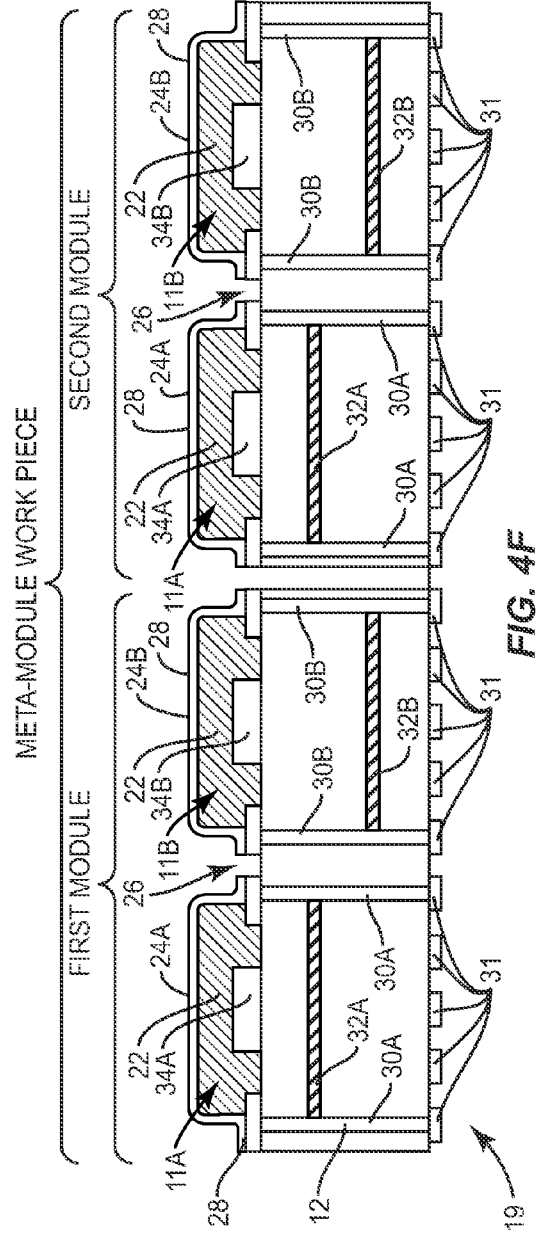

COMPARTMENTALIZED SHIELDING OF SELECTED COMPONENTS

RELATED APPLICATIONS

This application claims the benefit of U.S. provisional patent application No. 61/374,705, filed Aug. 18, 2010, entitled COMPREHENSIVE COMPARTMENTALIZED SHIELDING OF SELECTIVE COMPONENTS WITH INDIVIDUAL GROUNDING, the disclosure of which is incorporated herein by reference in its entirety. This application is also related to the following U.S. patent applications: application Ser. No. 11/199,319, now U.S. Pat. No. 7,451,539, filed Aug. 8, 2005, entitled METHOD OF MAKING A CONFORMAL ELECTROMAGNETIC INTERFERENCE SHIELD; application Ser. No. 11/435,913, now U.S. Pat. No. 8,062,930, filed May 17, 2006, entitled SUB-MODULE CONFORMAL ELECTROMAGNETIC INTERFERENCE SHIELD; application Ser. No. 11/768,014, now U.S. Pat. No. 8,053,872, filed Jun. 25, 2007, entitled INTEGRATED SHIELD FOR A NO-LEAD SEMICONDUCTOR DEVICE PACKAGE; application Ser. No. 11/952,484, filed Dec. 7, 2007, entitled FIELD BARRIER STRUCTURES WITHIN A CONFORMAL SHIELD; application Ser. No. 11/952,513, now U.S. Pat. No. 8,220,145, filed Dec. 7, 2007, entitled ISOLATED CONFORMAL SHIELDING; application Ser. No. 11/952,545, filed Dec. 7, 2007, entitled CONFORMAL SHIELDING EMPLOYING SEGMENT BUILDUP; application Ser. No. 12/766,347, filed Apr. 23, 2010, entitled CONFORMAL SHIELDING EMPLOYING SEGMENT BUILDUP (Continuation); application Ser. No. 11/952,592, now U.S. Pat. No. 8,409,658, filed Dec. 7, 2007, entitled CONFORMAL SHIELDING PROCESS USING FLUSH STRUCTURES; application Ser. No. 11/952,617, now U.S. Pat. No. 8,434,220, filed Dec. 7, 2007, entitled HEAT SINK FORMED WITH CONFORMAL SHIELD; application Ser. No. 11/952,634, now U.S. Pat. No. 8,186,048, filed Dec. 7, 2007, entitled CONFORMAL SHIELDING PROCESS USING PROCESS GASES; application Ser. No. 11/952,670, now U.S. Pat. No. 8,359,739, filed Dec. 7, 2007, entitled BOTTOM SIDE SUPPORT STRUCTURE FOR CONFORMAL SHIELDING PROCESS; application Ser. No. 11/952,690, now U.S. Pat. No. 8,061,012, filed Dec. 7, 2007, entitled BACKSIDE SEAL FOR CONFORMAL SHIELDING PROCESS; application Ser. No. 12/797,381, filed Jun. 9, 2010, INTEGRATED POWER AMPLIFIER AND TRANSCEIVER; application Ser. No. 12/913,364, now U.S. Pat. No. 8,296,938, filed Oct. 27, 2010, entitled BACKSIDE SEAL FOR CONFORMAL SHIELDING PROCESS (Divisional); application Ser. No. 13/034,755, now U.S. Pat. No. 8,959,762, filed Feb. 25, 2011, entitled ELECTRONIC MODULES HAVING GROUNDED ELECTROMAGNETIC SHIELDS; application Ser. No. 13/034,787, now U.S. Pat. No. 8,835,226, filed Feb. 25, 2011, entitled CONNECTION USUNG CONDUCTIVE VIAS; application Ser. No. 13/036,272, filed Feb. 28, 2011, entitled MICROSHIELD ON STANDARD QFN PACKAGE; application Ser. No. 13/117,284, now U.S. Pat. No. 8,296,941, filed May 27, 2011, entitled CONFORMAL SHIELDING EMPLOYING SEGMENT BUILDUP; and application Ser. No. 13/151,499, now U.S. Pat. No. 8,720,051, filed Jun. 2, 2011, entitled CONFORMAL SHIELDING USING PROCESS GASES; the disclosures of which are incorporated herein by reference in their entireties.

FIELD OF THE DISCLOSURE

The embodiments described herein related to producing electronic modules. More particularly, the embodiments described herein relate to manufacturing modules having electrically isolated shield compartments.

BACKGROUND

Typical electronic circuit boards that contain signal transmitters and receivers use one of two methods for implementing shielding between electrical blocks that are non signal symbiotic in function. Compartments enclosing circuits are either realized by placing a metal frame (sometimes referred to as a Faraday Cage) around the area to be shielded at the time of manufacture followed by a solder reflow assembly process step to secure the metal frame in place. A second common type of implementation is to apply a cover with pre-constructed compartments over the areas to be segregated as a post assembly process. Both methods are widely used in the electronics industry today. Both methods require separate piece parts and, as such, have several disadvantages.

Furthermore, the electronics and communications industry is pushing to more highly integrated circuits and system. In particular, the smaller size circuit blocks reduce the overall size of products. As the size of the circuit blocks are reduced, the need for isolation between various types of functional circuit blocks in close proximity to one another has increased. Co-locating circuit blocks with high degrees of signal emissions as well as circuits that are susceptible to noisy environments is a growing problem as technology drives toward further miniaturization. Thus, there is a need to develop a method by which isolation between these blocks is achieved while providing a more highly integrated system.

SUMMARY

Embodiments described in the detailed description relate to devices and a method for manufacturing a module having a first shielded compartment and a second shielded compartment, wherein the first shielded compartment is electrically isolated from the second shielded compartment. Electrical conductivity is controlled in a manner in which current flow between shielded circuits is directed to reduce or eliminate energy from being coupled between one or more shielded compartments on the same module. Each module may have individual shielded compartments, where each of the compartments has a dedicated ground plane. The shields for each compartment may be tied to the dedicated ground plane of the compartment. Because the dedicated ground planes are not tied together, each of the shielded compartments on the module remains isolated from all the other shielded compartments on the module. In some embodiments, having several shielded compartments, there is at least one isolated shielded compartment depending upon the design needs of the module.

As an exemplary embodiment, a module may have multiple shielded compartments formed by a process including forming a module having a first circuit and a second circuit on a first surface of a substrate. Thereafter, a dielectric material may be applied to the module to form a body of the module. A portion of the body of the module may be removed to expose a portion of a metallic layer grid about a periphery of the first circuit and about a periphery of the second circuit. A conductive material is then applied to the body of the module and an exposed portion of the metallic layer grid to form a first shielded compartment associated with the first circuit and a second shielded compartment associated with a second circuit. Thereafter, a portion of the conductive material and the metallic layer grid may be removed to electrically isolate the first shielded compartment of the module from the second shielded compartment of the module.

Another exemplary embodiment includes a method for manufacturing an electronic module. First, a meta-module work piece for manufacturing modules may be provided. The meta-module work piece may include a top side having a metallic layer grid, where the metallic layer grid forms a periphery about first electrical component areas and second electrical component areas, and the each of the first electrical component areas corresponds to a first electric circuit and each of the second electrical component areas corresponds to a second electric circuit. Components for each first electric circuit and each second electric circuit may be mounted onto the meta-module work piece. Thereafter, a dielectric material may be applied to the top side of the meta-module work piece to form an over-mold body. The over-mold body of the meta-module work-piece may be sliced through to form bodies corresponding to each first component area and each second component area of each module and expose a portion of the metallic layer grid about the periphery of each of the bodies. A conductive material may then be applied to the meta-module work piece to cover each of the bodies and the exposed portions of the metallic layer grid about the periphery of each of the bodies to form a first shielded compartment and a second shielded compartment on each of the modules, where the first shielded compartment and the second shielded compartment of each of the modules are electrically coupled by a conductive path. Thereafter, the conductive material and the metallic layer grid may be sub-diced through to break a conductive path between the first shielded compartment and the second shielded compartment on each of the modules. The meta-module work piece may be singulated to form the modules, wherein each of the modules includes the first shielded compartment and the second shielded compartment.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 4A-F depict cutaway views of a meta-module work piece used to produce a module having two or more electrically isolated shielded compartments.

DETAILED DESCRIPTION

Figure 1:
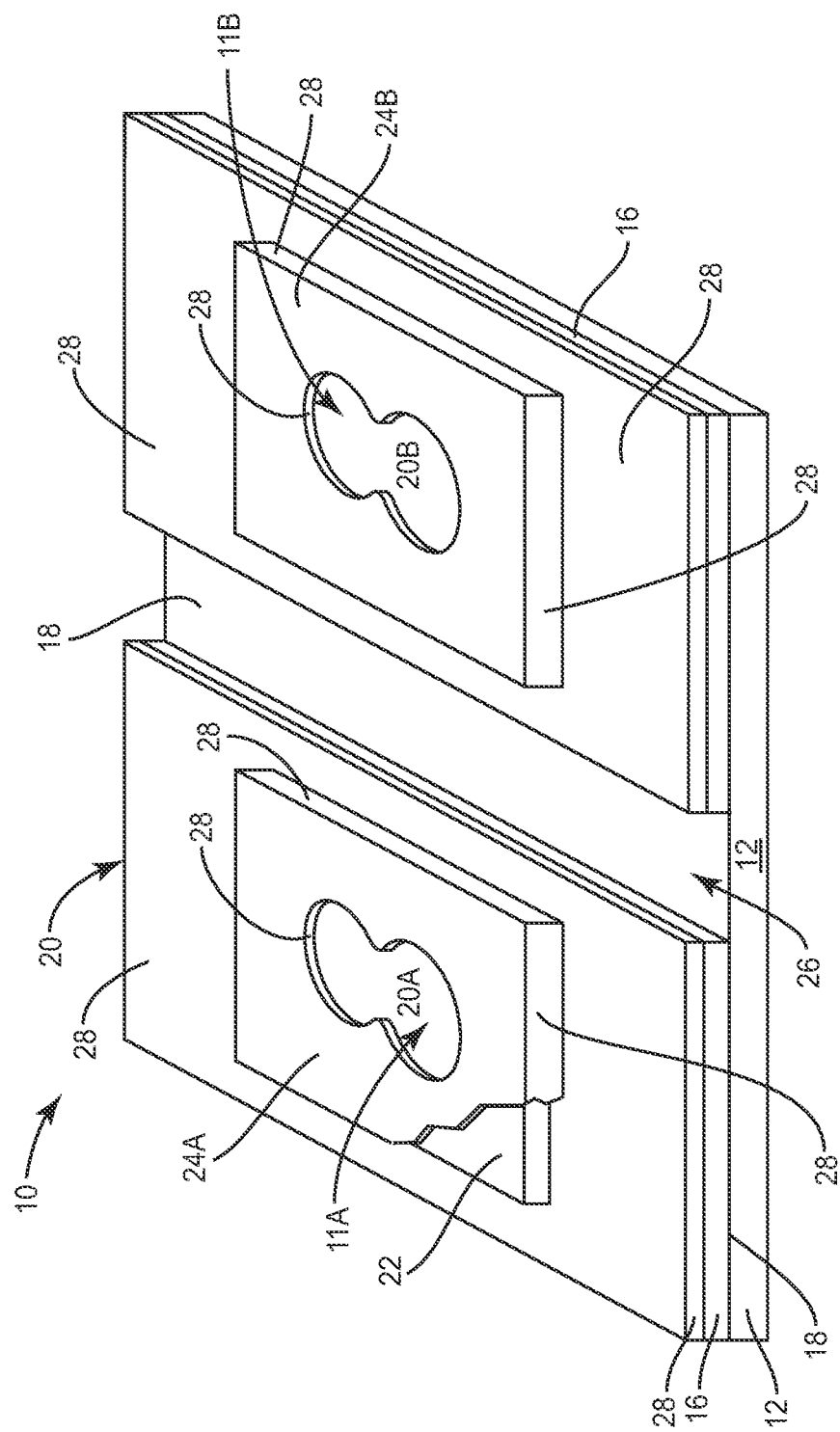
FIG. 1 depicts a module having two electrically isolated shielded compartments.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments described herein relate to devices and a method for manufacturing a module having a first shielded compartment and a second shielded compartment, wherein the first shielded compartment is electrically isolated from the second shielded compartment. Electrical conductivity is controlled in a manner in which current flow between shielded circuits is directed to reduce or eliminate energy from being coupled between one or more shielded compartments on the same module. Each module may have two or more individual shielded compartments, where each compartment has a dedicated ground plane. The shield for each compartment may be tied to the dedicated ground plane of the compartment. Because the dedicated ground planes are not tied together, each of the shielded compartments on the modules remains isolated from all the other shielded compartments on the modules. In some embodiments having two or more shielded compartments, there is at least one isolated shielded compartment depending upon the design needs of the module.

As an exemplary embodiment, a module may have multiple shielded compartments formed by a process including forming a module having a first circuit and a second circuit on a first surface of a substrate. Thereafter, a dielectric material may be applied to the module to form a body of the module. A portion of the body of the module may be removed to expose a portion of a metallic layer grid about a periphery of the first circuit and about a periphery of the second circuit. A conductive material is then applied to the body of the module and an exposed portion of the metallic layer grid to form a first shielded compartment associated with the first circuit and a second shielded compartment associated with a second circuit. Thereafter, a portion of the conductive material and the metallic layer grid may be removed to electrically isolate the first shielded compartment of the module from the second shielded compartment of the module.

Another exemplary embodiment includes a method for manufacturing an electronic module. First, a meta-module work piece for manufacturing modules may be provided. The meta-module work piece may include a top side having a metallic layer grid, where the metallic layer grid forms a periphery about first electrical component areas and second electrical component areas, and the each of the first electrical component areas corresponds to a first electric circuit and each of the second electrical component areas corresponds to a second electric circuit. Components for each first electric circuit and each second electric circuit may be mounted onto the meta-module work piece. Thereafter, a dielectric material may be applied to the top side of the meta-module work piece to form an over-mold body. The over-mold body of the meta-module work-piece may be sliced through to form bodies corresponding to each first component area and each second component area of each module and expose a portion of the metallic layer grid about the periphery of each of the bodies. A conductive material may then be applied to the meta-module work piece to cover each of the bodies and the exposed portions of the metallic layer grid about the periphery of each of the bodies to form a first shielded compartment and a second shielded compartment on each of the modules, where the first shielded compartment and the second shielded compartment of each of the modules are electrically coupled by a conductive path. Thereafter, the conductive material and the metallic layer grid may be sub-diced through to break a conductive path between the first shielded compartment and the second shielded compartment on each of the modules. The meta-module work piece may be singulated to form the modules, wherein each of the modules includes the first shielded compartment and the second shielded compartment.

Figure 2:
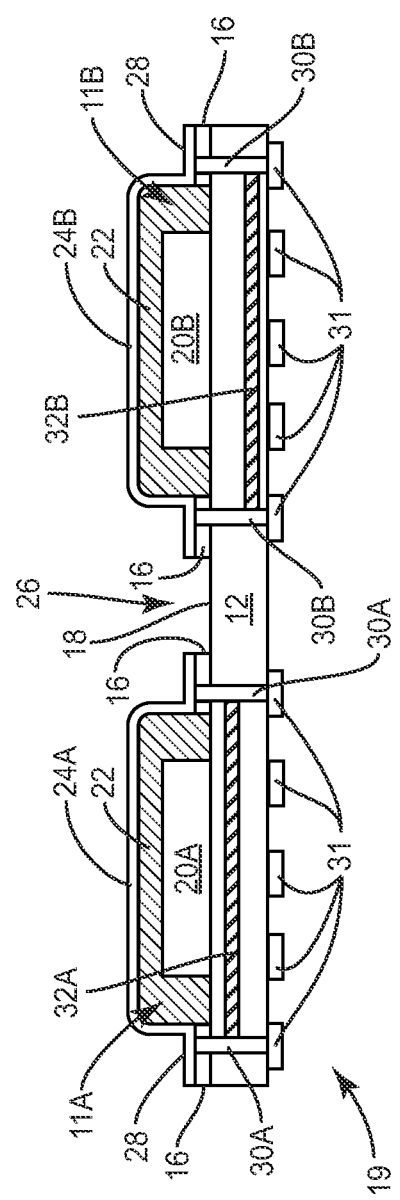
FIG. 2 depicts a cutaway view of the module of FIG. 1, which has two electrically isolated shielded compartments.
Figure 11:
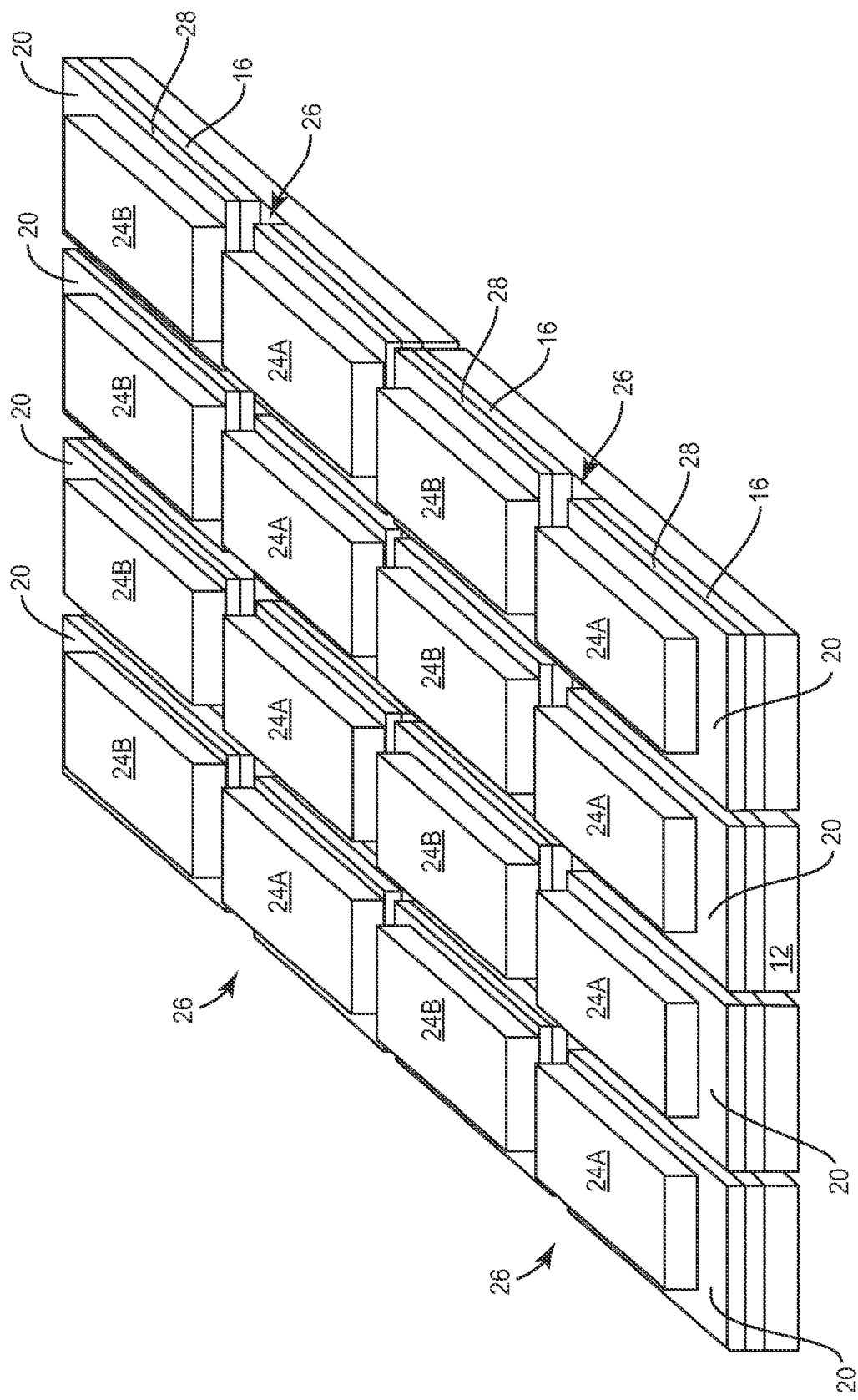
FIG. 11 depicts a perspective view of the individual modules of the meta-module following segmentation of the meta-module, as also depicted in FIG. 4F.

FIGS. 1-2 depict an embodiment of a module 10 having a first shielded compartment 11A and a second shielded compartment 11B formed on a substrate 12. FIG. 1 depicts a perspective view of the module 10 after the module 10 is singulated from a meta-module work piece having modules, as depicted in FIG. 4F and FIG. 11.

Figure 3:
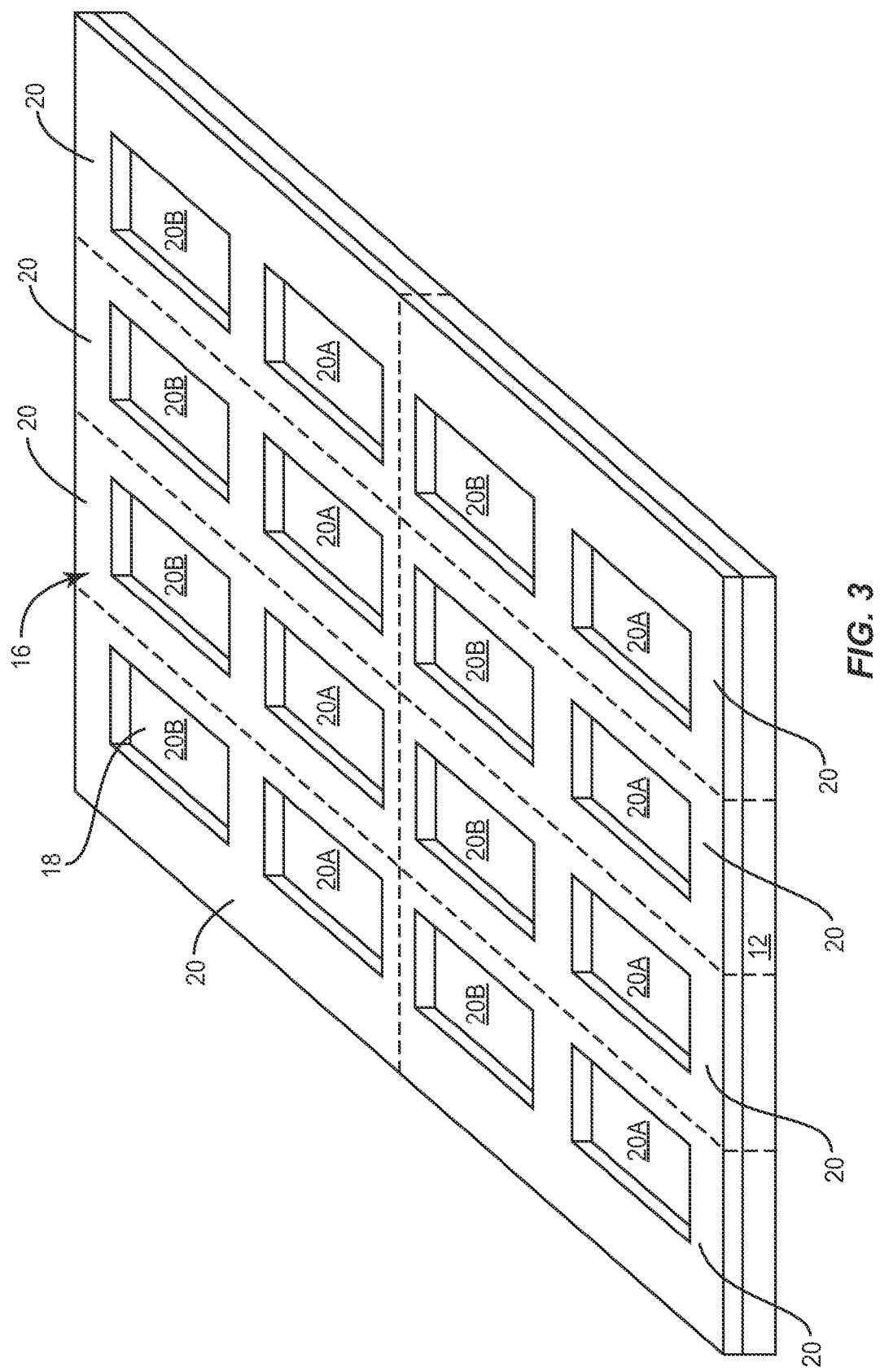
FIG. 3 depicts a perspective view of a meta-module work piece including a substrate and a metallic layer grid on the top of the substrate.

Returning to FIGS. 1 and 2, FIG. 2 depicts a cross-sectional view of the module depicted in FIG. 1. As depicted in FIGS. 1 and 2, the module 10 includes a substrate 12 and a metal layer 14. The substrate 12 may be a laminate having a plurality of layers. The laminated layers of the substrate 12 may include prepreg material. The metal layer 14 is configured to form a metallic layer grid 16 on to a surface 18 of the substrate 12, as shown in FIG. 3. The metallic layer grid 16 may be used to form shield metal contacts or metal traces on the substrate 12 to which a conductive material may bond to form the first shielded compartment 11A and the second shielded compartment 11B. The bottom surface 19 of the substrate 12, as shown in FIGS. 4A-F, may include contact pads 31. Some exemplary embodiments may further include signal traces on the bottom 19 of the substrate 12. The metallic layer grid 16 may be electrically coupled to a first ground plane 32A and a second ground plane 32B in the interior portion of the substrate 12 and electrical contact pads 31 on the bottom surface of the substrate 12 by vias 30A and 30B. However, as discussed in greater detail below, in some embodiment, the first ground plane 32A and the second ground plane 32B may be electrically isolated from each other except for the electrical coupling provided by the metallic layer grid 16.

FIG. 3 depicts the substrate 12 and metallic layer grid 16 of a meta-module work piece that may be used to simultaneously make multiple modules 10. The metallic layer grid 16 may be used to form a peripheral metallic structure or traces around a first electrical component area 20A and a second electrical component area 20B, as shown in FIGS. 1-3. As outlined by the dashed lines in FIG. 3, each of the modules 10 includes a module area 20 having the first electrical component area 20A and the second electrical component area 20B. As shown in FIGS. 1 and 2, body 22 may be formed from a dielectric material that resides over the substrate 12 and, in some cases, a portion of the metallic layer grid 16. The shield metal contacts or metal traces encompasses the body 22 associated with the first electrical component area 20A and the body 22 associated with the second electrical component area 20B. A first electromagnetic shield 24A and a second electromagnetic shield 24B are formed by applying a conductive material 28 to the body 22 and exposed portions of the metallic layer grid 16 associated with the first shielded compartment 11A and the second shielded compartment 11B.

As depicted in FIGS. 1 and 2, the first shielded compartment 11A may be electrically isolated from the second shielded compartment 11B by a cutout 26. The cutout 26 removes the conductive material 28 and a portion of the metallic layer grid 16 located between the first shielded compartment 11A and the second shielded compartment 11B. The first shielded compartment 11A may be formed by coupling the first electromagnetic shield 24A, with one or more vias 30A, to a first ground plane 32A, as depicted in FIG. 2. The second shielded compartment 11B may be formed by coupling the second electromagnetic shield 24B, with one or more vias 30B, to a second ground plane 32B, as depicted in FIG. 2. The first ground plane 32A may be electrically isolated from the second ground plane 32B. In addition, in some embodiments, signal traces may not run between the first shielded compartment 11A and the second shielded compartment 11B.

FIGS. 4A-F depict cutaway view of stages of processing a meta-module work piece used to produce modules. The modules may have two or more electrically isolated shield compartments. In some exemplary embodiments, some modules may include one or more electrically coupled shielded compartments and one or more electrically isolated shielded compartments. FIG. 3 and FIGS. 6-11 depict a perspective view of the meta-module work piece undergoing the stages of processing the meta-module work piece, as depicted in FIGS. 4A-F.

Figure 5:
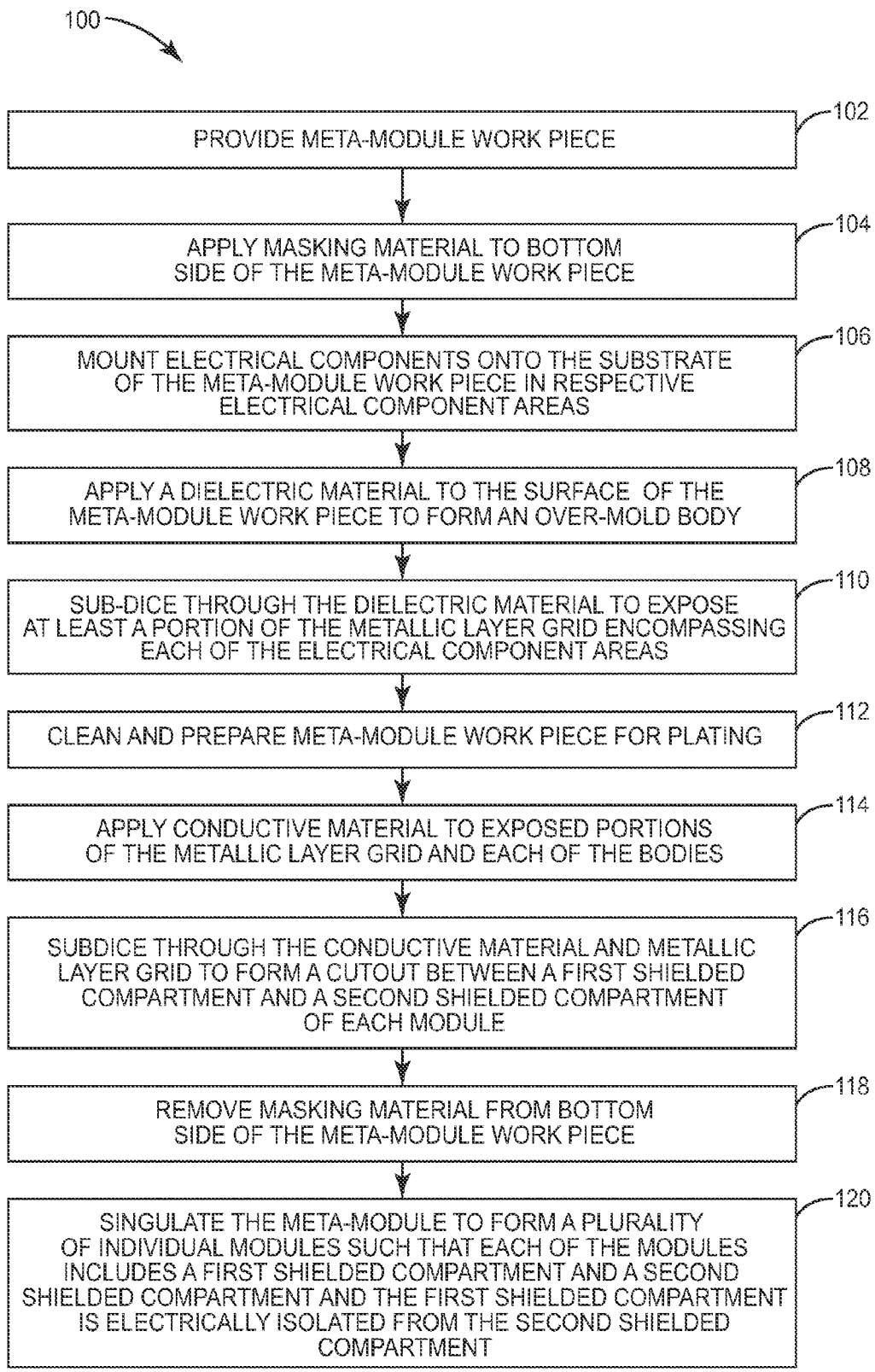
FIG. 5 depicts a flow diagram of process steps related to FIG. 4A-FIG. 3, and FIGS. 6-10.

FIG. 5 depicts a flow diagram of a process 100 that corresponds to the stages of processing the meta-model work-piece, as depicted in FIGS. 3, 4A-F and FIGS. 6-11. A substrate 12 having a metallic layer grid 16, as depicted in FIG. 3, is provided as a meta-module work piece, (step 102). The meta-module work-piece permits simultaneous production of the modules 10. The metallic layer grid 16 provides a shield metal contact or traces about the periphery of the first electrical component area 20A and second electrical component area 20B of each of the modules 10 to be formed on the meta-module work piece. In addition, a masking material 33 may be applied to the bottom surface 19 of the meta-module work piece to protect electrical contact pads 31, as depicted in FIG. 4A, (step 104). The masking material 33 may include a soluble material or coating. Alternatively, the masking material 33 may be a masking tape applied to bottom surface 19 of the meta-module work piece. The bottom side of the meta-module may be protected by a masking tape. The masking tape may also be generally referred to as a platers tape. The masking tape may be applied to the bottom surface 19 of the meta-module work piece prior to a plating process. The masking tape may form a conformal seal around the entire bottom surface 19 of the substrate 12. The conformal seal around the entire bottom surface 19 may prevent the electroless and electrolytic chemistry from contacting the contact pads 31 located on the bottom surface 19.

Figure 6:
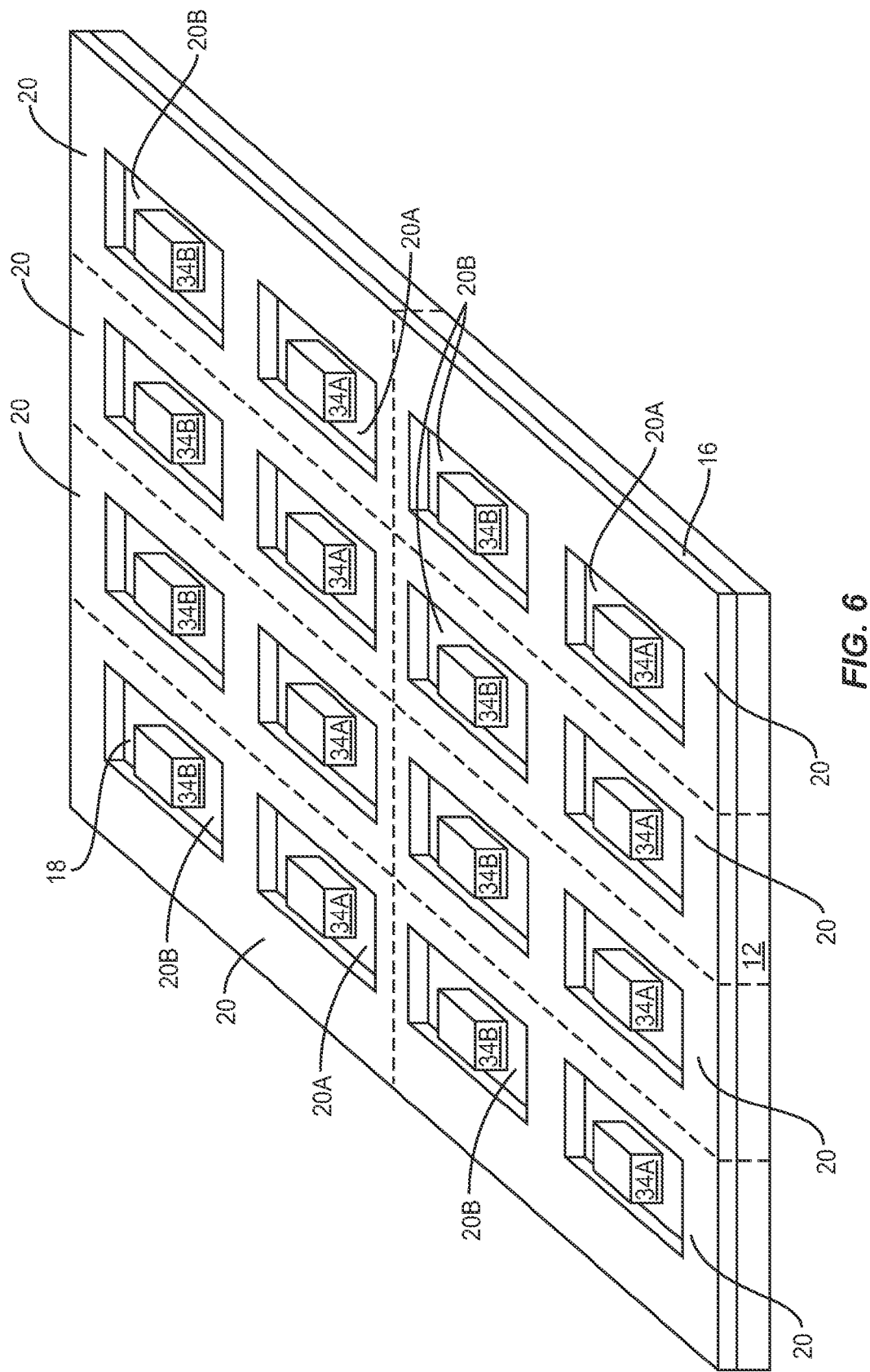
FIG. 6 depicts a perspective view of the meta-module work piece of FIG. 3 having components placed on the meta-module work piece, as shown in the cutaway view of FIG. 4B.

As depicted in FIG. 4A and FIG. 6, electronic components or circuitry 34 may be placed onto the substrate 12 of the meta-module work piece, (step 106), such that the electronic components or circuitry 34 are mounted, secured, and/or attached to corresponding electrical component areas of each individual module's module area 20.

The module area 20 corresponding to each of the modules on the meta-module work piece is outlined by the dashed lines appearing on the meta-module work piece. As an example, depicted in FIG. 4A and FIG. 6, the first electronic circuitry 34A may be placed in the first electrical component area 20A. The second electronic circuitry 34B may be placed in the second electrical component area 20B. The first electronic circuitry 34A may be the same as the second electronic circuitry 34B. Alternatively, the first electronic circuitry 34A and second electronic circuitry 34B may be different types of circuitry.

Figure 7:
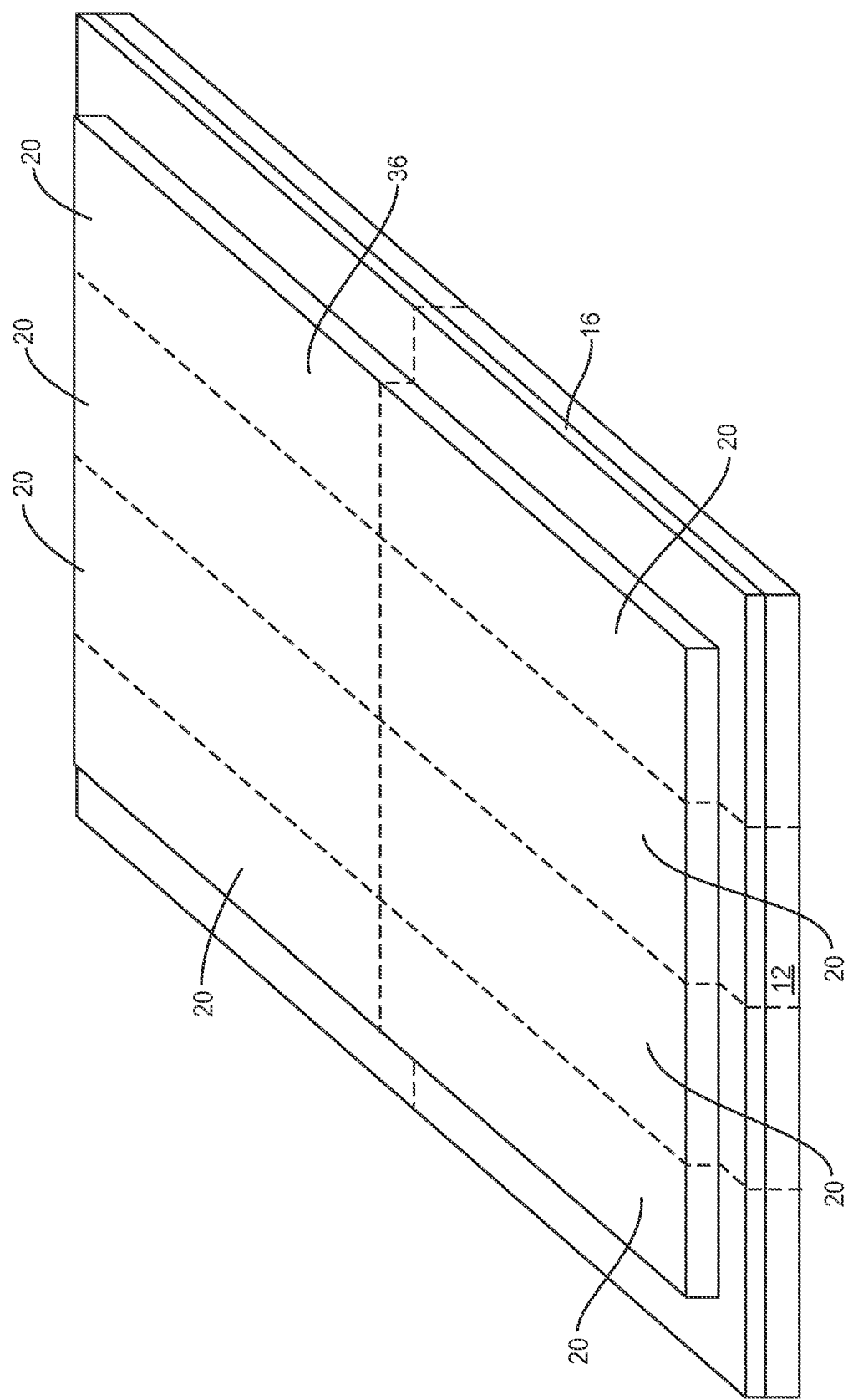
FIG. 7 depicts a perspective view of a dielectric material deposited onto the meta-module work piece, as depicted in the cutaway view of FIG. 4C.

As further depicted in FIG. 4B and FIG. 7, after the first electronic circuitry 34A and the second electronic circuitry 34B are placed on the substrate 12, a dielectric material 35 may be applied to the meta-module work piece to form an over-mold body 36 that covers the first electronic circuitry 34A, the second electronic circuitry 34B, and the metallic layer grid 16, (step 108).

Figure 8:
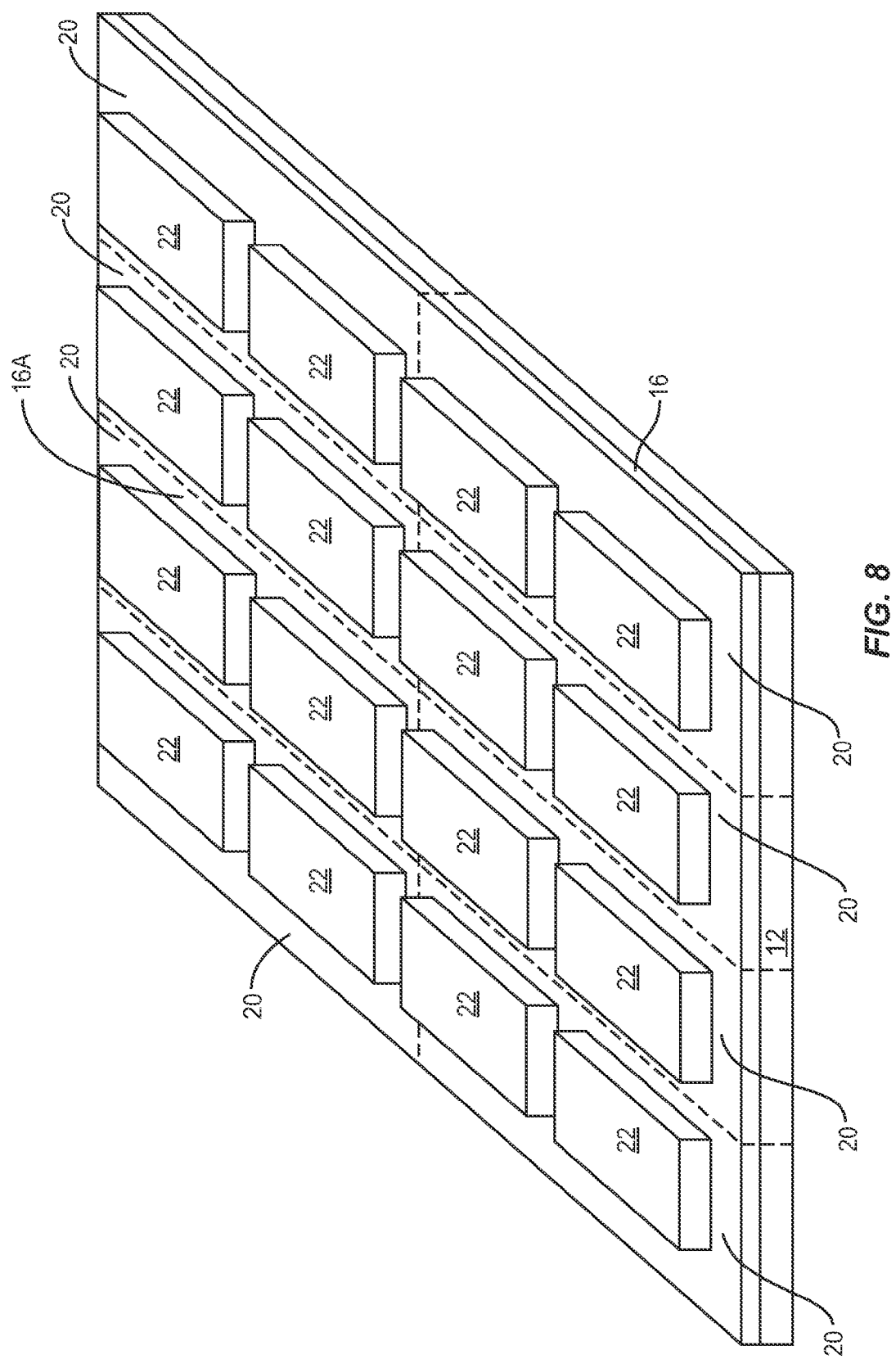
FIG. 8 depicts a perspective view of the meta-module work piece after sub-dicing the dielectric material to form an over-mold body, as depicted in the cutaway view of FIG. 4D.

Thereafter, as depicted in FIG. 4C and FIG. 8, the over-mold body 36 is sub-diced, through the dielectric material of the over-mold body 36, to form the body 22 corresponding to each of the first electronic circuitry 34A and the second electronic circuitry 34B and expose at least a portion of the metallic layer grid 16A, (step 110). In some embodiment, a small portion of the metallic layer grid 16 may be removed to ensure that the portion of the metallic layer grid 16A is exposed. The exposed portions of the metallic layer grid 16A forms shield metal contacts or metal traces about the periphery of the first electronic circuitry 34A and about the periphery of the second electronic circuitry 34B. The shield metal contacts or metal traces may provide a surface to which a conductive material 38 may be applied to form a first electromagnetic shield 24A of the first shielded compartment 11A and the second electromagnetic shield 24B of the second shielded compartment 11B, as depicted in FIG. 9.

Figure 9:
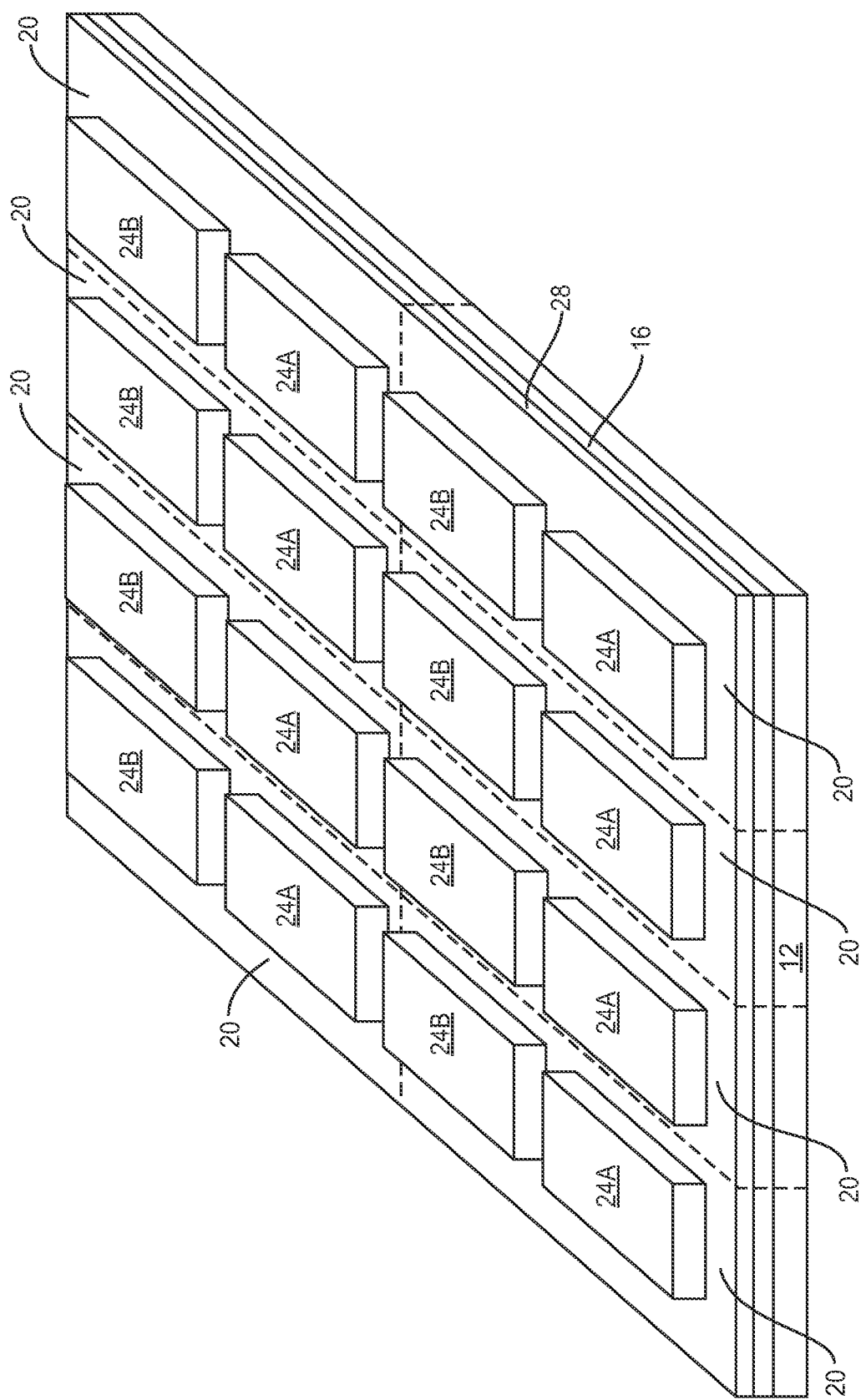
FIG. 9 depicts a perspective view of the meta-module work piece after addition of a conductive material to the top surface of the meta-module work piece.

After the meta-module work piece is cleaned and prepared for plating, (step 112), as depicted in FIG. 4D and 9, the conductive material 38 may be applied over at least a portion of each body 22 and the exposed portions of the metallic layer grid 16A, (step 114). The conductive material 28 may be laid down in layers to form a first electromagnetic shield 24A and a second electromagnetic shield 24B for each of the modules of the meta-module.

In some embodiments, the work piece may be cleaned prior to plating. As an example, the meta-modules may be cleaned using a plasma cleaning process, which may also be referred to as an ash process. In the plasma cleaning process, the meta-module is placed in a vacuum chamber. A mixture of Argon with 1-5% Oxygen is introduced to the system. High frequency voltages are applied to ionze the low pressure gas. The plasma reacts to the exposed surfaces of the meta-module work piece to clean organic contaminants off the meta-module work piece. In addition, a chemical process or a mechanical process may be used to roughen the exterior surfaces of each body 22 to improve adherence of the conductive material 38. The surfaces of the body 22 may also be roughed using a plasma cleaning process. The plasma cleaning process may also be used to clean any exposed metal, prepreg material, or laminate surfaces.

To form a first layer of electromagnetic shield material, an electroless plating process may be performed to deposit a seed layer 40 of a conductive material 28 on top of the body 22 and in contact with the exposed portions of the metallic layer grid 16 of each of the modules. In an exemplary embodiment, the seed layer 40 of conductive material 28 may be Copper (Cu), Aluminum (Al), Silver (Ag), Gold (Au), or other conductive material. An electroless plating process is defined herein to be a chemical deposition of metal instead of electrical-based deposition.

An exemplary electroless plating process of copper (Cu) on a dielectric substrate may require prior deposition of a catalyst such as a palladium-tin (Pd—Sn) colloid consisting of a metallic Pd core surrounded by a stabilizing layer of Sn ions. The activation operation (deposition of the colloid) is usually followed by an acceleration operation (removal of excess ionic tin). Adhesion of the deposit to the substrate may be improved by the mechanical or chemical pretreatment operations.

After the seed layer 40 of conductive material 28 is created over the body 22 of each of the modules in the meta-module and in contact with the exposed portions of the metallic layer grid 16A, an electrolytic plating process is performed to deposit a second layer 42 of conductive material 28 on top of the seed layer 40. In an exemplary embodiment, the second layer 42 of conductive material 28 may be Cu, Al, Ag, Au, or other conductive material. It should be appreciated that the exposed portions of the metallic layer grid 16A are electrically coupled to the seed layer 40, and the seed layer 40 may carry the current for the electrolytic plating process.

After the second layer 42 is created, a third layer 44 is created on top of the second layer 42 through a second electrolytic plating process. The third layer 44 may be comparatively a poor conductor, and may be a layer of low stress nickel (Ni). Nickel serves to protect the conductive layers so that they do not tarnish, corrode, or otherwise suffer from environmental effects. Likewise, nickel may contribute to the shielding function by absorbing electromagnetic radiation.

Figure 10:
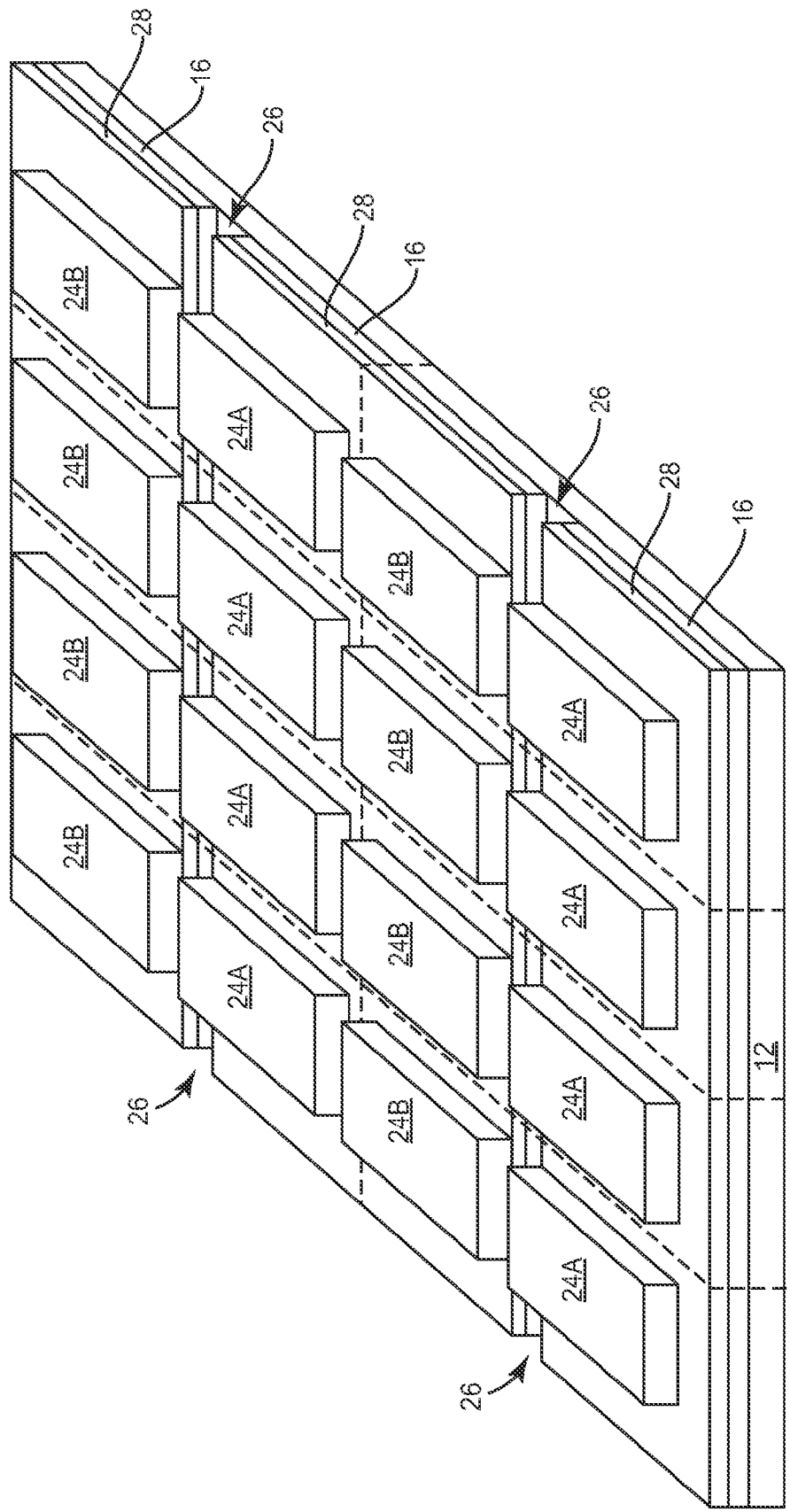
FIG. 10 depicts a perspective view of the meta-module work piece following sub-dicing of the meta-module surface.

As depicted in FIG. 4E and FIG. 10, after the electromagnetic shield material is applied, the each of the modules on the meta-module is sub-diced through the conductive material 28 and a portion of the metallic layer grid 16 to form a cutout 26. The cutout 26 isolates the first electromagnetic shield 24A of the first shielded compartment 11A from the second electromagnetic shield 24B of the second shielded compartment 11B for each of the modules 10, (step 116). Thereafter, as depicted in FIG. 4F and in FIG. 11, the meta-module is singulated to separate the modules 10 into individual modules, (step 118). Similar to the module 10 of FIGS. 1-2, each of the individual modules 10 of FIGS. 4F and 11 include a first shielded compartment 11A and a second shielded compartment 11B. In addition, the first shielded compartment 11A is electrically isolated from the second shielded compartment 11B. Because the first shielded compartment 11A is electrically isolated from the second shielded compartment, ground currents do not circulate between the first electromagnetic shield 24A and the second electromagnetic shield 24B. In addition, similar to the module 10 of FIG. 2, the first ground plane 32A associated with the first shielded compartment 11A may be electrically isolated from the second ground plane 32B associated with the second shielded compartment 11B, as depicted in FIGS. 4A-F.

Those skilled in the art will recognize improvements and modifications to the embodiments of the present disclosure. All such improvements and modifications are considered within the scope of the concepts disclosed herein and the claims that follow.

What is claimed is:

1. A module having multiple shielded compartments formed by a process comprising:

forming a module having a first circuit and a second circuit on a first surface of a substrate;

applying a dielectric material to the module to form a body of the module;

removing a portion of the body of the module to expose a portion of a metallic layer grid about a periphery of the first circuit and about a periphery of the second circuit;

applying a conductive material to the body of the module and an exposed portion of the metallic layer grid to form a first shielded compartment associated with the first circuit and a second shielded compartment associated with the second circuit; and removing a portion of the conductive material and the metallic layer grid to electrically isolate the first shielded compartment of the module from the second shielded compartment of the module, without cutting all of the way through the substrate.

2. The module formed by the process of claim 1 further comprising roughening an exposed surface of the body prior to applying the conductive material.

3. The module formed by the process of claim 1 wherein applying the conductive material to the body of the module and the exposed portion of the metallic layer grid to form the first shielded compartment associated with the first circuit and the second shielded compartment associated with the second circuit comprises:

depositing a seed layer of conductive material on the body of the module and the exposed portion of the metallic layer grid;

generating a second layer on top of the seed layer of conductive material through an electrolytic plating process; and generating a third layer of material on top of the second layer through a second electrolytic plating process.

4. The module formed by the process of claim 3 wherein the seed layer of conductive material is Copper (Cu).

5. The module formed by the process of claim 3 wherein depositing the seed layer of conductive material comprises using an electroless plating process.

6. The module of claim 3 wherein the third layer of material is formed from Nickel (Ni).

7. The module formed by the process of claim 1 wherein removing the portion of the conductive material and the metallic layer grid to electrically isolate the first shielded compartment from the second shielded compartment comprises sub-dicing through the body of the module and a portion of the metallic layer grid between the first shielded compartment and the second shielded compartment.

8. The module formed by the process of claim 1 wherein removing the portion of the body of the module to expose the portion of the metallic layer grid about the periphery of the first circuit and about the periphery of the second circuit includes removing a small portion of a top surface of the metallic layer grid.

9. The module formed by the process of claim 1 wherein the substrate includes a first ground plane associated with the first circuit and a second ground plane associated with the second circuit.

10. The module formed by the process of claim 9 wherein the first ground plane is electrically isolated from the second ground plane.

11. The module formed by the process of claim 9 wherein the first ground plane is electrically coupled to the first shielded compartment and the second ground plane is electrically coupled to the second shielded compartment.

12. The module formed by the process of claim 9 wherein the substrate includes a plurality of interior layers;

wherein the first ground plane is on one of the plurality of interior layers; and wherein the second ground plane is on one of the plurality of interior layers.

13. The module formed by the process of claim 9 wherein the substrate includes a second surface opposite the first surface, and wherein the second surface includes a first plurality of pads associated with the first circuit and a second plurality of pads associated with the second circuit.

14. The module of claim 13 further comprising removing a mask from the second surface after applying the conductive material.

15. The module formed by the process of claim 1 wherein a meta-module work piece includes a plurality of modules, and the plurality of modules includes the module, the process further comprising:

singulating the meta-module work piece to separate the module from the plurality of modules.

16. The module formed by the process of claim 15 wherein removing the portion of the conductive material and the metallic layer grid to electrically isolate the first shielded compartment from the second shielded compartment comprises sub-dicing the plurality of modules such that after singulating the meta-module work piece the first shielded compartment of the module is electrically isolated from the second shielded compartment of the module.

17. A method for manufacturing an electronic module comprising:

providing a meta-module work piece for manufacturing a plurality of modules, wherein the meta-module work piece includes a top side having a metallic layer grid, wherein the metallic layer grid forms a periphery about a plurality of first electrical component areas and a plurality of second electrical component areas, and each of the first electrical component areas corresponds to a first electric circuit and each of the second electrical component areas corresponds to a second electric circuit;

mounting components for each first electric circuit and each second electric circuit onto the meta-module work piece;

applying a dielectric material to the top side of the meta-module work piece to form an over-mold body;

sub-dicing through the over-mold body of the meta-module work-piece to form a plurality of bodies and expose a portion of the metallic layer grid about the periphery of each of the plurality of bodies;

applying a conductive material to the meta-module work piece to cover each of the plurality of bodies and the exposed portions of the metallic layer grid about the periphery of each of the plurality of bodies to form a first shielded compartment and a second shielded compartment on each of the modules, wherein the first shielded compartment and the second shielded compartment of each of the modules are electrically coupled by a conductive path;

sub-dicing through the conductive material and the metallic layer grid to break the conductive path between the first shielded compartment and the second shielded compartment on each of the modules, without cutting all of the way through the substrate;

singulating the meta-module work piece to form the plurality of modules, wherein each of the modules includes the first shield compartment and the second shielded compartment.

* * * * *

UNITED STATES PATENT AND TRADEMARK OFFICE
CERTIFICATE OF CORRECTION

| | | |
|---|---|---|
| PATENT NO. | : 9,137,934 B2 | Page 1 of 1 |
| APPLICATION NO. | : 13/189838 | |
| DATED | : September 15, 2015 | |
| INVENTOR(S) | : Thomas Scott Morris et al. | |

It is certified that error appears in the above-identified patent and that said Letters Patent is hereby corrected as shown below:

In the Specification:

In column 7, line 26, replace "conductive material 38" with --conductive material 28--.

In column 7, line 32, replace "conductive material 38" with --conductive material 28--.

In column 7, lines 49-50, replace "conductive material 38" with --conductive material 28--.

Signed and Sealed this
Second Day of February, 2016

Michelle K. Lee
*Director of the United States Patent and Trademark Office*